United States Patent
Chang et al.

(10) Patent No.: US 7,029,365 B2
(45) Date of Patent: Apr. 18, 2006

(54) PAD ASSEMBLY FOR ELECTROCHEMICAL MECHANICAL PROCESSING

(75) Inventors: Shou-Sung Chang, Stanford, CA (US); Stan D Tsai, Fremont, CA (US); Donald J. K. Olgado, Palo Alto, CA (US); Liang-Yuh Chen, Foster City, CA (US); Alain Duboust, Sunnyvale, CA (US); Ralph M. Wadensweiler, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 97 days.

(21) Appl. No.: 10/744,904

(22) Filed: Dec. 23, 2003

(65) Prior Publication Data

US 2004/0163946 A1 Aug. 26, 2004

Related U.S. Application Data

(63) Continuation-in-part of application No. 10/642,128, filed on Aug. 15, 2003, now Pat. No. 6,962,524, which is a continuation-in-part of application No. 10/608,513, filed on Jun. 26, 2003, which is a continuation-in-part of application No. 10/140,010, filed on May 7, 2002, now Pat. No. 6,979,248, which is a continuation-in-part of application No. 10/211,626, filed on Aug. 2, 2002, which is a continuation-in-part of application No. 10/033,732, filed on Dec. 27, 2001, which is a continuation-in-part of application No. 09/505,899, filed on Feb. 17, 2000, now Pat. No. 6,537,144, said application No. 10/608,513 is a continuation-in-part of application No. 10/210,972, filed on Aug. 2, 2002, which is a continuation-in-part of application No. 10/151,538, filed on May 16, 2002, now abandoned, said application No. 10/642,128 is a continuation-in-part of application No. 10/391,324, filed on Mar. 18, 2003, which is a continuation-in-part of application No. 10/244,688, filed on Sep. 16, 2002, now Pat. No. 6,848,970.

(51) Int. Cl.
| | |
|---|---|
| B24D 11/02 | (2006.01) |
| C25F 3/00 | (2006.01) |
| C25D 17/00 | (2006.01) |
| C25C 7/04 | (2006.01) |

(52) U.S. Cl. ............... 451/5; 451/533; 204/224 M; 205/672

(58) Field of Classification Search ............... 451/5, 451/41, 54, 60, 283–288, 446, 526–539; 204/224 M, 224 R, 279, 288.3; 205/97, 205/118, 672, 668
See application file for complete search history.

(56) References Cited

U.S. PATENT DOCUMENTS

| | | |
|---|---|---|
| 1,601,642 A | 9/1926 | Parker |
| 1,927,162 A | 9/1933 | Fiedler et al. |
| 2,112,691 A | 3/1938 | Crowder |
| 2,240,265 A | 4/1941 | Nachtman |
| 2,392,687 A | 1/1946 | Nachtman |
| 2,431,065 A | 11/1947 | Miller |
| 2,451,341 A | 10/1948 | Jemstedt |
| 2,453,481 A | 11/1948 | Wilson |
| 2,454,935 A | 11/1948 | Miller |
| 2,456,185 A | 12/1948 | Grube |
| 2,457,510 A | 12/1948 | van Omum |
| 2,458,676 A | 1/1949 | Brenner et al. |
| 2,461,556 A | 2/1949 | Lorig |
| 2,473,290 A | 6/1949 | Millard |
| 2,477,808 A | 8/1949 | Jones |
| 2,479,323 A | 8/1949 | Davis |
| 2,480,022 A | 8/1949 | Hogaboom |
| 2,490,055 A | 12/1949 | Hoff |
| 2,495,695 A | 1/1950 | Camin et al. |
| 2,500,205 A | 3/1950 | Schaefer |
| 2,500,206 A | 3/1950 | Schaefer et al. |
| 2,503,863 A | 4/1950 | Bart |
| 2,506,794 A | 5/1950 | Kennedy et al. |
| 2,509,304 A | 5/1950 | Klein |
| 2,512,328 A | 6/1950 | Hays |
| 2,517,907 A | 8/1950 | Mikulas |

| Patent No. | Date | Inventor | Class |
|---|---|---|---|
| 2,519,945 A | 8/1950 | Twele et al. | |
| 2,530,677 A | 11/1950 | Berkenkotter et al. | |
| 2,535,966 A | 12/1950 | Teplitz | |
| 2,536,912 A | 1/1951 | Cobertt | |
| 2,539,898 A | 1/1951 | Davis | |
| 2,540,175 A | 2/1951 | Rosenqvist | |
| 2,544,510 A | 3/1951 | Prahl | |
| 2,549,678 A | 4/1951 | Flandt | |
| 2,544,943 A | 5/1951 | Farmer | |
| 2,554,943 A | 5/1951 | Farmer | |
| 2,556,017 A | 6/1951 | Vonada | |
| 2,560,534 A | 7/1951 | Adler | |
| 2,560,966 A | 7/1951 | Lee | |
| 2,569,577 A | 10/1951 | Reading | |
| 2,569,578 A | 10/1951 | Rieger | |
| 2,571,709 A | 10/1951 | Gray | |
| 2,576,074 A | 11/1951 | Nachtman | |
| 2,587,630 A | 3/1952 | Konrad et al. | |
| 2,619,454 A | 11/1952 | Zapponi | |
| 2,633,452 A | 3/1953 | Hogaboom, Jr. et al. | |
| 2,646,398 A | 7/1953 | Henderson | |
| 2,656,283 A | 10/1953 | Fink et al. | |
| 2,656,284 A | 10/1953 | Toulmin | |
| 2,657,177 A | 10/1953 | Rendel | |
| 2,657,457 A | 11/1953 | Toulmin | |
| 2,673,836 A | 3/1954 | Vonada | |
| 2,674,550 A | 4/1954 | Dunlevy et al. | |
| 2,675,348 A | 4/1954 | Greenspan | |
| 2,680,710 A | 6/1954 | Kenmore et al. | |
| 2,684,939 A | 7/1954 | Geese | |
| 2,696,859 A | 8/1954 | Gray et al. | |
| 2,689,215 A | 9/1954 | Bart | |
| 2,695,269 A | 11/1954 | de Witz et al. | |
| 2,698,832 A | 1/1955 | Swanson | |
| 2,706,173 A | 4/1955 | Wells et al. | |
| 2,706,175 A | 4/1955 | Licharz | |
| 2,708,445 A | 5/1955 | Manson et al. | |
| 2,710,834 A | 6/1955 | Vrilakas | |
| 2,711,993 A | 6/1955 | Lyon | |
| 3,162,588 A | 12/1964 | Bell | 204/141 |
| 3,334,041 A | 8/1967 | Dyer et al. | |
| 3,433,730 A | 3/1969 | Kennedy et al. | |
| 3,448,023 A | 6/1969 | Bell | 204/143 |
| 3,476,677 A | 11/1969 | Corley et al. | |
| 3,607,707 A | 9/1971 | Chenevier | |
| 3,873,512 A | 3/1975 | Latanision | 204/129.46 |
| 3,942,959 A | 3/1976 | Markoo et al. | |
| 3,992,178 A | 11/1976 | Markoo et al. | |
| 4,047,902 A | 9/1977 | Wiand | |
| 4,082,638 A | 4/1978 | Jumer | |
| 4,119,515 A | 10/1978 | Costakis | |
| 4,125,444 A | 11/1978 | Inoue | 204/129.43 |
| 4,312,716 A | 1/1982 | Maschler et al. | |
| 4,523,411 A | 6/1985 | Freerks | |
| 4,704,511 A | 11/1987 | Miyano | |
| 4,713,149 A | 12/1987 | Hoshino | 204/23 |
| 4,752,371 A | 6/1988 | Kreisel et al. | |
| 4,772,361 A | 9/1988 | Dorsett et al. | |
| 4,793,895 A | 12/1988 | Kaanta et al. | 156/627 |
| 4,839,993 A | 6/1989 | Masuko et al. | 51/129 |
| 4,934,102 A | 6/1990 | Leach et al. | 51/50 R |
| 4,954,141 A | 9/1990 | Takiyama et al. | 51/296 |
| 4,956,056 A | 9/1990 | Zubatova et al. | 204/129.43 |
| 5,011,510 A | 4/1991 | Hayakawa et al. | |
| 5,061,294 A | 10/1991 | Harmer et al. | |
| 5,066,370 A | 11/1991 | Andreshak et al. | |
| 5,096,550 A | 3/1992 | Mayer et al. | 204/129.1 |
| 5,108,463 A | 4/1992 | Buchanan | |
| 5,136,817 A | 8/1992 | Tabata et al. | 51/165.71 |
| 5,137,542 A | 8/1992 | Buchanan et al. | |
| 5,203,884 A | 4/1993 | Buchanan et al. | |
| 5,217,586 A | 6/1993 | Datta et al. | 204/192.6 |
| 5,225,034 A | 7/1993 | Yu et al. | 156/636 |
| 5,257,478 A | 11/1993 | Hyde et al. | 51/131.3 |
| 5,328,716 A | 7/1994 | Buchanan | |
| 5,478,435 A | 12/1995 | Murphy et al. | 156/636.1 |
| 5,534,106 A | 7/1996 | Cote et al. | 156/636.1 |
| 5,543,032 A | 8/1996 | Datta et al. | 205/670 |
| 5,560,753 A | 10/1996 | Schnabel et al. | |
| 5,562,529 A | 10/1996 | Kishii et al. | |
| 5,567,300 A | 10/1996 | Datta et al. | 205/652 |
| 5,575,706 A | 11/1996 | Tsai et al. | 451/41 |
| 5,578,362 A | 11/1996 | Reinhardt et al. | 428/147 |
| 5,624,300 A | 4/1997 | Kishii et al. | 451/36 |
| 5,633,068 A | 5/1997 | Ryoke et al. | |
| 5,654,078 A | 8/1997 | Ferronato | |
| 5,674,122 A | 10/1997 | Krech | |
| 5,702,811 A | 12/1997 | Ho et al. | |
| 5,738,574 A | 4/1998 | Tolles et al. | 451/288 |
| 5,804,507 A | 9/1998 | Perlov et al. | 438/692 |
| 5,807,165 A | 9/1998 | Uzoh et al. | 451/41 |
| 5,823,854 A | 10/1998 | Chen | |
| 5,840,190 A | 11/1998 | Scholander et al. | |
| 5,840,629 A | 11/1998 | Carpio | 438/692 |
| 5,846,882 A | 12/1998 | Birang | 438/692 |
| 5,871,392 A | 2/1999 | Meikle et al. | 451/56 |
| 5,882,491 A | 3/1999 | Wardle | |
| 5,893,796 A | 4/1999 | Birang et al. | 451/526 |
| 5,911,619 A * | 6/1999 | Uzoh et al. | 451/5 |
| 5,938,801 A | 8/1999 | Robinson | 51/306 |
| 5,948,697 A | 9/1999 | Hata | |
| 5,985,093 A | 11/1999 | Chen | |
| 6,001,008 A | 12/1999 | Fujimori et al. | 451/443 |
| 6,004,880 A | 12/1999 | Liu et al. | 438/692 |
| 6,017,265 A | 1/2000 | Cook et al. | 451/41 |
| 6,020,264 A | 2/2000 | Lustig et al. | 438/692 |
| 6,024,630 A | 2/2000 | Shendon et al. | 451/41 |
| 6,033,293 A | 3/2000 | Crevasse et al. | 451/494 |
| 6,056,851 A | 5/2000 | Hsieh et al. | 156/345 |
| 6,066,030 A | 5/2000 | Uzoh | 451/41 |
| 6,074,284 A | 6/2000 | Tani et al. | |
| 6,077,337 A | 6/2000 | Lee | 106/3 |
| 6,090,239 A | 7/2000 | Liu et al. | 156/345 |
| 6,103,096 A | 8/2000 | Datta et al. | 205/686 |
| 6,116,998 A | 9/2000 | Damgaard et al. | 451/490 |
| 6,132,292 A | 10/2000 | Kubo | |
| 6,153,043 A | 11/2000 | Edelstein et al. | 156/345 |
| 6,156,124 A | 12/2000 | Tobin | 118/719 |
| 6,159,079 A | 12/2000 | Zuniga et al. | 451/41 |
| 6,171,467 B1 | 1/2001 | Weihs et al. | 205/93 |
| 6,176,992 B1 | 1/2001 | Talieh | 205/87 |
| 6,176,998 B1 | 1/2001 | Wardle et al. | |
| 6,183,354 B1 | 2/2001 | Zuniga et al. | |
| 6,190,494 B1 | 2/2001 | Dow | |
| 6,210,257 B1 | 4/2001 | Carlson | 451/56 |
| 6,234,870 B1 | 5/2001 | Uzoh et al. | 451/8 |
| 6,238,271 B1 | 5/2001 | Cesna | 451/41 |
| 6,238,592 B1 | 5/2001 | Hardy et al. | 252/79.1 |
| 6,244,935 B1 | 6/2001 | Birang et al. | 451/41 |
| 6,248,222 B1 | 6/2001 | Wang | 204/297.09 |
| 6,251,235 B1 | 6/2001 | Talieh et al. | 204/220 |
| 6,257,953 B1 | 7/2001 | Gitis et al. | |
| 6,258,223 B1 | 7/2001 | Cheung et al. | |
| 6,261,168 B1 | 7/2001 | Jensen et al. | 451/527 |
| 6,261,959 B1 | 7/2001 | Travis et al. | 438/692 |
| 6,273,798 B1 | 8/2001 | Berman | 451/72 |
| 6,296,557 B1 | 10/2001 | Walker | |
| 6,297,159 B1 | 10/2001 | Paton | 438/693 |
| 6,319,108 B1 | 11/2001 | Adefris et al. | |
| 6,319,420 B1 | 11/2001 | Dow | |
| 6,322,422 B1 | 11/2001 | Satou | |
| 6,328,642 B1 | 12/2001 | Pant et al. | 451/307 |
| 6,328,872 B1 | 12/2001 | Talieh et al. | 205/206 |
| 6,331,135 B1 | 12/2001 | Sabde et al. | 451/41 |
| 6,368,184 B1 | 4/2002 | Beckage | |
| 6,368,190 B1 | 4/2002 | Easter et al. | |

| | | |
|---|---|---|
| 6,372,001 B1 | 4/2002 | Omar et al. |
| 6,379,223 B1 * | 4/2002 | Sun et al. ............... 451/41 |
| 6,381,169 B1 | 4/2002 | Bocian et al. ........... 365/151 |
| 6,383,066 B1 | 5/2002 | Chen et al. |
| 6,386,956 B1 | 5/2002 | Sato et al. ............... 451/57 |
| 6,391,166 B1 | 5/2002 | Wang .................... 204/224 R |
| 6,395,152 B1 | 5/2002 | Wang .................... 204/224 M |
| 6,402,591 B1 | 6/2002 | Thornton ................. 451/36 |
| 6,402,925 B1 | 6/2002 | Talieh |
| 6,406,363 B1 | 6/2002 | Xu et al. ................ 451/296 |
| 6,409,904 B1 | 6/2002 | Uzoh et al. ............. 205/137 |
| 6,413,388 B1 * | 7/2002 | Uzoh et al. ............ 204/224 R |
| 6,428,394 B1 | 8/2002 | Mooring et al. .......... 451/41 |
| 6,431,968 B1 | 8/2002 | Chen et al. |
| 6,440,295 B1 | 8/2002 | Wang ..................... 205/640 |
| 6,447,668 B1 | 9/2002 | Wang |
| 6,471,847 B1 | 10/2002 | Talieh et al. ............. 205/147 |
| 6,475,332 B1 | 11/2002 | Boyd et al. ........... 156/345.12 |
| 6,479,962 B1 | 11/2002 | Ziemkowski et al. |
| 6,482,307 B1 | 11/2002 | Ashjaee et al. .......... 205/103 |
| 6,497,800 B1 * | 12/2002 | Talieh et al. ........... 204/224 R |
| 6,517,426 B1 | 2/2003 | Lee |
| 6,520,843 B1 | 2/2003 | Halley .................... 451/285 |
| 6,537,140 B1 | 3/2003 | Miller et al. |
| 6,537,144 B1 | 3/2003 | Tsai et al. .............. 451/526 |
| 6,551,179 B1 | 4/2003 | Halley .................... 451/285 |
| 6,561,889 B1 | 5/2003 | Xu et al. ................ 451/526 |
| 6,569,004 B1 | 5/2003 | Pham ..................... 451/526 |
| 6,572,463 B1 | 6/2003 | Xu et al. ................ 451/526 |
| 6,585,579 B1 | 7/2003 | Jensen et al. ............ 451/527 |
| 6,630,059 B1 | 10/2003 | Uzoh et al. ............. 204/212 |
| 6,641,471 B1 | 11/2003 | Pinheiro et al. |
| 6,656,019 B1 * | 12/2003 | Chen et al. ............... 451/41 |
| 6,666,959 B1 | 12/2003 | Uzoh et al. |
| 6,685,548 B1 | 2/2004 | Chen et al. |
| 8,892,338 | 2/2004 | Kirchner |
| 6,739,951 B1 | 5/2004 | Sun et al. |
| 6,752,700 B1 | 6/2004 | Duescher |
| 6,769,969 B1 | 8/2004 | Duescher |
| 6,802,855 B1 | 10/2004 | Emesh et al. |
| 6,848,977 B1 | 2/2005 | Cook et al. |
| 2001/0005667 A1 | 6/2001 | Tolles et al. |
| 2001/0024878 A1 | 9/2001 | Nakamura ............... 438/691 |
| 2001/0027018 A1 | 10/2001 | Molnar .................. 438/690 |
| 2001/0035354 A1 | 11/2001 | Ashjaee et al. .......... 205/103 |
| 2001/0036746 A1 | 11/2001 | Sato et al. ............. 438/745 |
| 2001/0040100 A1 | 11/2001 | Wang .................... 205/220 |
| 2001/0042690 A1 | 11/2001 | Talieh ................... 205/118 |
| 2002/0008036 A1 | 1/2002 | Wang .................... 205/118 |
| 2002/0011417 A1 | 1/2002 | Talieh et al. ............ 205/157 |
| 2002/0020621 A1 | 2/2002 | Uzoh et al. ............. 204/212 |
| 2002/0025760 A1 | 2/2002 | Lee et al. |
| 2002/0025763 A1 | 2/2002 | Lee et al. ................ 451/41 |
| 2002/0070126 A1 | 6/2002 | Sato ..................... 205/640 |
| 2002/0077037 A1 | 6/2002 | Tietz .................... 451/41 |
| 2002/0088715 A1 | 7/2002 | Talieh et al. ............ 205/157 |
| 2002/0108861 A1 | 8/2002 | Emesh et al. ............ 205/81 |
| 2002/0119286 A1 | 8/2002 | Chen et al. ............. 428/131 |
| 2002/0123300 A1 | 9/2002 | Jones et al. |
| 2002/0130049 A1 | 9/2002 | Chen et al. ............. 205/640 |
| 2002/0130634 A1 | 9/2002 | Ziemkowski et al. ...... 320/106 |
| 2002/0146963 A1 | 10/2002 | Teetzel |
| 2002/0148732 A1 | 10/2002 | Emesh et al. |
| 2003/0013397 A1 | 1/2003 | Rhoades |
| 2003/0034131 A1 | 2/2003 | Park et al. ............ 156/345.12 |
| 2003/0040188 A1 | 2/2003 | Hsu et al. |
| 2003/0114087 A1 | 6/2003 | Duboust et al. .......... 451/41 |
| 2003/0116445 A1 | 6/2003 | Sun et al. .............. 205/674 |
| 2003/0116446 A1 | 6/2003 | Duboust et al. ......... 205/682 |
| 2003/0213703 A1 | 11/2003 | Wang et al. ............ 205/662 |
| 2003/0220053 A1 | 11/2003 | Manens et al. |

FOREIGN PATENT DOCUMENTS

| | | |
|---|---|---|
| EP | 0 325 753 | 8/1989 |
| EP | 0 455 455 | 11/1991 |
| EP | 1361023 | 11/2003 |
| JP | 58-171264 | 10/1983 |
| JP | 61-079666 | 4/1986 |
| JP | 6-1265279 | 11/1986 |
| JP | 63-028512 | 2/1988 |
| JP | 05-277957 | 10/1993 |
| JP | 06-047678 | 2/1994 |
| JP | 10-006213 | 1/1998 |
| JP | 11-042554 | 2/1999 |
| JP | 2870537 | 3/1999 |
| JP | 2000-218513 | 8/2000 |
| JP | 11-216663 | 12/2000 |
| JP | 2001-77117 | 3/2001 |
| JP | 2001-179611 | 7/2001 |
| JP | 2001-244223 | 9/2001 |
| JP | 2002334858 A * | 11/2002 |
| KR | 2003-037158 | 5/2003 |
| SU | 1618538 | 1/1991 |
| WO | WO 93/15879 | 8/1993 |
| WO | 98/49723 | 11/1998 |
| WO | 99/41434 | 8/1999 |
| WO | 99/53119 | 10/1999 |
| WO | 00/03426 | 1/2000 |
| WO | 00/26443 | 5/2000 |
| WO | 00/33356 | 6/2000 |
| WO | 00/59682 | 10/2000 |
| WO | WO 00/71297 | 11/2000 |
| WO | 01/13416 | 2/2001 |
| WO | 01/49452 | 7/2001 |
| WO | 01/52307 | 7/2001 |
| WO | 01/63018 | 8/2001 |
| WO | 01/71066 | 9/2001 |
| WO | 01/88229 | 11/2001 |
| WO | 01/88954 | 11/2001 |
| WO | 02/23616 | 3/2002 |
| WO | 02/064314 | 8/2002 |
| WO | WO 02/075804 | 9/2002 |
| WO | 03/001581 | 1/2003 |

OTHER PUBLICATIONS

Partial International Search / PCT Invitation to pay additional fees dated Nov. 14, 2002.
Notification regarding review of justification for invitation to pay additional fees for PCT/US/02/11009 dated Feb. 25, 2003.
International Search Report for PCT/US 02/11009 dated Feb. 25, 2003.
PCT Written Opinion dated Apr. 1, 2003 for PCT/US02/11009.
Notification of Transmittal of International Preliminary Examination Report dated Nov. 10, 2003.
European Search Report for 03252801.0, dated Jan. 16, 2004.
Communication pursuant to Article 96(2) EPC for Application No. 02728965.4, dated Jun. 11, 2004.
Copy of Search Report issued by the Austrian Patent Office for corresponding Singapore Patent Application No. 200302562-4, provided by letter dated Oct. 7, 2004.
Invitation to pay additional fees dated Nov. 11, 2004.
Notification of Transmittal of International Search Report and Written Opinion dated Feb. 21, 2005.
Notification of transmittal of the International Search report and Written Opinion dated Mar. 14, 2005.
PCT International Search Report and Written Opinion dated Apr. 28, 2005 for PCT/US04/037870.

Alexander, Jr., "Electrically Conductive Polymer Nanocomposite Materials", http://www.afrlhorizons.com/Briefs/Sept02/ML0206.html printed Feb. 19, 2003.

Contolini, "Electrochemical Planarization of ULSI Copper," Solid State Technology, vol. 40, No. 6, Jun. 1, 1997.

Nogami, "An Innovation in Integrate Porous Low-K Materials and Copper," *InterConnect Japan 2001*; Honeywell Seminar Dec. 6, 2001, p 1-12.

European Search Report for EP 032254807-5, dated Sep. 27, 2005 (APPM/004100.EPC.03).

\* cited by examiner

*Primary Examiner*—David B. Thomas
(74) *Attorney, Agent, or Firm*—Patterson & Sheridan

(57) ABSTRACT

Embodiments of a pad assembly for processing a substrate are provided. The pad assembly includes a processing layer having a working surface adapted to process a substrate, a lower layer coupled to and disposed below the processing layer, and an electrode having an upper surface disposed above the lower layer and below the working surface of the processing layer. The upper surface of the electrode is at least partially exposed to the working surface to provide an electrolyte pathway between the upper surface of the electrode and the working surface.

31 Claims, 8 Drawing Sheets

PAD ASSEMBLY FOR ELECTROCHEMICAL MECHANICAL PROCESSING

CROSS-REFERENCE TO RELATED APPLICATIONS

This application is a continuation-in-part of U.S. patent application Ser. No. 10/642,128, filed Aug. 15, 2003 Now U.S. Pat. No. 6,962,524 (hereinafter the '128 application). The '128 application is a continuation-in-part of co-pending U.S. patent application Ser. No. 10/608,513, filed Jun. 26, 2003 (hereinafter referred to as the "'513 application"), which is a continuation-in-part of U.S. patent application Ser. No. 10/140,010, filed May 7, 2002 Now U.S. Pat. No. 6,979,248. The '513 application is also a continuation-in-part of co-pending U.S. patent application Ser. No. 10/211,626, filed Aug. 2, 2002, which is a continuation-in-part of co-pending U.S. patent application Ser. No. 10/033,732, filed Dec. 27, 2001, which is a continuation-in-part of U.S. patent application Ser. No. 09/505,899, filed Feb. 17, 2000 Now U.S. Pat. No. 6,537,144. The '513 application is additionally a continuation-in-part of co-pending U.S. patent application Ser. No. 10/210,972, filed Aug. 2, 2002; which is also a continuation-in-part of U.S. patent application Ser. No. 09/505,899, filed Feb. 17, 2000 Now U.S. Pat. No. 6,537,144. The '513 application is further a continuation-in-part of U.S. patent application Ser. No. 10/151,538, filed May 16, 2002 Now abandoned. The '128 application is also a continuation-in-part of co-pending U.S. patent application Ser. No. 10/244,697, filed Sep. 16, 2002, which is a continuation-in-part of U.S. application Ser. No. 10/244,688, filed Sep. 16, 2002 Now U.S. Pat. No. 6,848,970, and of co-pending U.S. patent application Ser. No. 10/391,324, filed Mar. 18, 2003. All of the above referenced applications are hereby incorporated by reference in their entireties.

This application is additionally related to U.S. patent application Ser. No. 10/033,732, filed on Dec. 27, 2001; U.S. patent application Ser. No. 10/455,941, filed Jun. 6, 2003; and U.S. patent application Ser. No. 10/455,895, filed Jun. 6, 2003, all of which are also incorporated herein by reference in their entireties.

BACKGROUND OF THE INVENTION

1. Field of the Invention

Embodiments of the present invention generally relate to a pad assembly for electrochemical mechanical processing.

2. Description of the Related Art

Electrochemical Mechanical Processing (ECMP) is a technique used to remove conductive materials from a substrate surface by electrochemical dissolution while concurrently polishing the substrate with reduced mechanical abrasion as compared to conventional Chemical Mechanical Polishing (CMP) processes. ECMP systems may generally be adapted for deposition of conductive material on the substrate by reversing the polarity of the bias. Electrochemical dissolution is performed by applying a bias between a cathode and a substrate surface to remove conductive materials from the substrate surface into a surrounding electrolyte. The bias may be applied to the substrate surface by a conductive contact disposed on or through a polishing material upon which the substrate is processed. A mechanical component of the polishing process is performed by providing relative motion between the substrate and the polishing material that enhances the removal of the conductive material from the substrate.

Copper is one material that may be polished using electrochemical mechanical polishing. Typically, copper is polished utilizing a two-step process. In the first step, the bulk of the copper is removed, typically leaving some copper residue on the substrate's surface. The copper residue is then removed in a second, or over-polishing, step.

During electrochemical processing, the copper layer disposed on the substrate is pressed against a polishing surface and is biased relative to an electrode. An electrolyte fluid is disposed between the copper layer and the electrode. The electrolyte completes an electrical circuit between the substrate and the electrode, which assists in the removal of material from the surface of the substrate. As the polishing surface and electrode are consumed during processing a number of substrates, periodic replacement of both the polishing surface and electrode is required, thus necessitating interruption of substrate processing. Therefore, it is desirable to configure the polishing surface, electrode and polishing system in general in a configuration that facilitates quick and efficient replacement of the polishing surface and electrode to minimize process interruptions.

Thus, there is a need for an improved apparatus for electrochemical mechanical processing.

SUMMARY OF THE INVENTION

In one embodiment, a pad assembly for processing a substrate are provided. The pad assembly includes a processing layer having a working surface adapted to process a substrate, a lower layer coupled to and disposed below the processing layer, and an electrode having an upper surface disposed above the lower layer and below the working surface of the processing layer. The upper surface of the electrode is at least partially exposed to the working surface to provide an electrolyte pathway between the upper surface of the electrode and the working surface.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

A processing pad assembly adapted to enhance uniform deposition/removal of material to/from a substrate is provided herein. The processing pad assembly is additionally configured to facilitate efficient removal and replacement, thereby improving system processing capacity. The processing pad assembly includes at least a processing pad having a working surface and an electrode. The processing pad is at least partially permeable to electrolyte and is adapted to allow biasing of a feature side of a substrate during processing. Although the embodiments disclosed below focus primarily on polishing a substrate, it is contemplated that the teachings disclosed herein may be used to electroplate a substrate by reversing the polarity of the bias.

Figure 1:
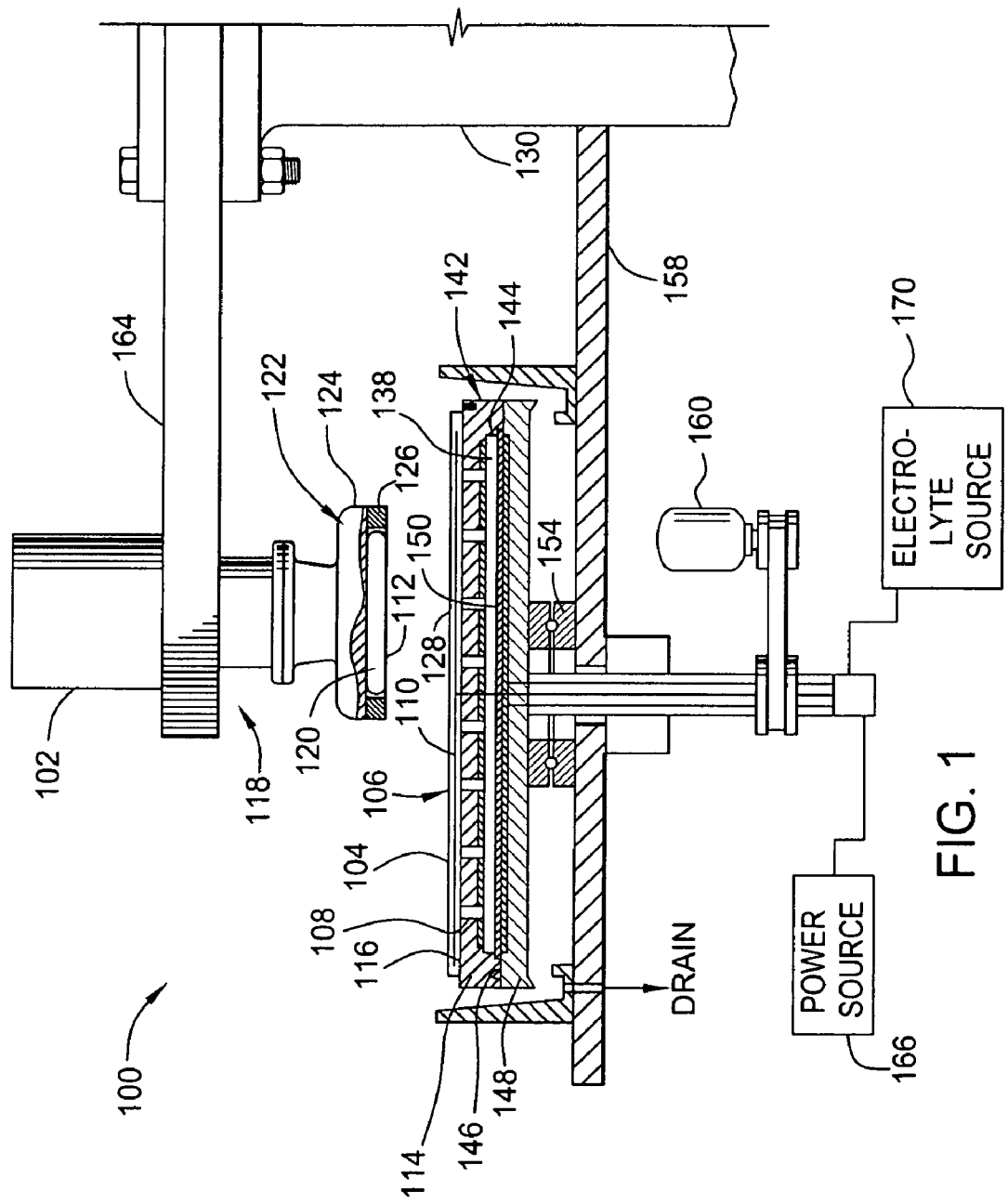
FIG. 1 is a schematic side view, partially in cross-section, of a processing station of an electrochemical mechanical processing system having a processing pad assembly.

FIG. 1 depicts a schematic, partial cross-sectional side view of a processing station 100 having one embodiment of a processing pad assembly 106 of the present invention. The processing station 100 includes a carrier head assembly 118 and a platen assembly 142. The carrier head assembly 118 is adapted to hold a feature side 112 of a substrate 120 against the platen assembly 142 while relative motion is provided therebetween to polish the feature side 112 of the substrate 120. The relative motion may be rotational, lateral, or some combination thereof, and is provided by at least one of the carrier head assembly 118 and the platen assembly 142.

In one embodiment, the carrier head assembly 118 is supported by an arm 164 coupled to a column 130 and which extends over the platen assembly 142. The carrier head assembly 118 generally includes a drive system 102 coupled to a carrier head 122. The drive system 102 generally provides at least rotational motion to the carrier head 122. The carrier head 122 additionally may be actuated toward the platen assembly 142 such that the substrate 120 retained in the carrier head 122 may be disposed against a processing surface 126 of the platen assembly 142 during processing.

In one embodiment, the carrier head 122 may be a TITAN HEAD™ or TITAN PROFILER™ wafer carrier manufactured by Applied Materials, Inc., of Santa Clara, Calif. Generally, the carrier head 122 comprises a housing 124 and retaining ring 126 that define a center recess in which the substrate 120 is retained. The retaining ring 126 circumscribes the substrate 120 disposed within the carrier head 122, while leaving the feature side 112 exposed, to prevent the substrate from slipping out from under the carrier head 122 during processing. It is contemplated that other polishing heads may be utilized.

The platen assembly 142 is rotationally disposed on a base 158. A bearing 154 is disposed between the platen assembly 142 and the base 158 to facilitate rotation of the platen assembly 142 relative to the base 158. A motor 160 is coupled to the platen assembly 142 to provide rotational motion.

In one embodiment, the platen assembly 142 includes an upper plate 114 and a lower plate 148. The upper plate 114 may be fabricated from a rigid material, such as a metal or rigid plastic, and in one embodiment, is fabricated from or coated with a dielectric material, such as chlorinated polyvinyl chloride (CPVC). The upper plate 114 may have a circular, rectangular or other geometric form with a substantially planar top surface 116. The top surface 116 of the upper plate 114 supports the pad assembly 106 thereon. The pad assembly 106 may be held to the top surface 116 of the upper plate 114 by magnetic attraction, electrostatic attraction, vacuum, adhesives, or the like.

The lower plate 148 is generally fabricated from a rigid material, such as aluminum and may be coupled to the upper plate 114 by any conventional means, such as a plurality of fasteners (not shown). Generally, a plurality of locating pins 146 (one is shown in FIG. 1) are disposed between the upper and lower plates 114, 148 to ensure alignment therebetween. The upper plate 114 and the lower plate 148 may optionally be fabricated from a single, unitary member.

A plenum 138 is defined in the platen assembly 142 and may be partially formed in at least one of the upper or lower plates 114, 148. In the embodiment depicted in FIG. 1, the plenum 138 is defined in a recess 144 partially formed in the lower surface of the upper plate 114. At least one hole 108 is formed in the upper plate 114 to allow electrolyte, provided to the plenum 138 from an electrolyte source 170, to flow through the platen assembly 142 and into contact with the substrate 120 during processing. The plenum 138 is partially bounded by a cover 150 coupled to the upper plate 114 enclosing the recess 144. Alternatively, the electrolyte may be dispensed from a pipe (not shown) onto the top surface of the pad assembly 106. It is contemplated that platen assemblies having other configurations may be utilized.

The pad assembly 106 includes at least a processing layer 104 and an electrode 110. The processing layer 104 has a working surface 128 that, in one embodiment, is adapted to polish the feature side 112 of the substrate 120 during processing. The working surface 128 may be smooth or patterned to facilitate distribution of a polishing fluid or electrolyte over the surface of the pad assembly 106. Patterns may include grooves, cutouts, perforations, and the like. The processing layer 104 may be fabricated from polymeric materials compatible with the process chemistry, examples of which include polyurethane, polycarbonate, fluoropolymers, PTFE, PTFA, polyphenylene sulfide (PPS), or combinations thereof, and other polishing materials used in polishing substrate surfaces. In one embodiment, the working surface 128 of the processing layer 104 is dielectric, for example, polyurethane or other polymer.

In another embodiment, the working surface 128 of the processing layer 104 may include conductive material or include conductive contact elements extending therefrom. For example, the working surface 128 may be fabricated from a conductive composite (i.e., the conductive elements are dispersed integrally with or comprise the material comprising the polishing surface), such as a polymer matrix having conductive particles dispersed therein or a conductive coated fabric, among others. Examples of processing layers that may be adapted to benefit from the invention are described in U.S. patent application Ser. No. 10/455,941, filed Jun. 6, 2003 by Y. Hu et al. (entitled "CONDUCTIVE POLISHING ARTICLE FOR ELECTROCHEMICAL MECHANICAL POLISHING") and U.S. patent application Ser. No. 10/455,895, filed Jun. 6, 2003 by Y. Hu et al. (entitled "CONDUCTIVE POLISHING ARTICLE FOR ELECTROCHEMICAL MECHANICAL POLISHING"), both of which are hereby incorporated by reference in their entireties.

The electrode 110 is generally positioned between the working surface 128 of the processing layer 104 and the top surface 116 of the platen assembly 142. The electrode 110 can be a plate-like member or laminate, a plate having multiple apertures formed therethrough, or a plurality of electrode pieces disposed in a permeable membrane or container. For example, the electrode 110 may be a metal foil, a mesh made of metal wire or metal-coated wire, or a laminated metal layer on a polymer film compatible with the electrolyte, such as a polyimide, polyester, flouroethylene, polypropylene, or polyethylene sheet. The electrode 110 may act as a single electrode, or may comprise multiple independent electrode zones isolated from each other. Zoned electrodes are discussed in U.S. patent application Ser. No. 10/642,128, filed Aug. 15, 2003, which is hereby incorporated by reference in its entirety.

The electrode 110 is fabricated of a material compatible with electrolyte chemistries and generally has a low bulk conductivity. The stiffness of the electrode 110 should be low enough to ensure the processing layer 104 conforms to the substrate 120 and retains a generally flat profile (i.e., does not have a "potato chip" form).

The electrode 110 is typically comprised of a corrosion resistant conductive material, such as metals, conductive alloys, metal coated fabrics, conductive polymers, conductive pads, and the like. Conductive metals include Sn, Ni, Cu, Au, and the like. Conductive metals also include a corrosion resistant metal such as Sn, Ni, or Au coated over an active metal such as Cu, Zn, Al, and the like. Conductive alloys include inorganic alloys and metal alloys such as bronze, brass, stainless steel, or palladium-tin alloys, among others. Metal coated fabric may be woven or non-woven with any corrosion resistant metal coating. Conductive pads consist of conductive fillers disposed in a polymer matrix.

When metal is used as material for the electrode 110, it may be a solid sheet. Alternatively, the electrode 110 may be perforated or formed of a metal screen in order to increase surface area, which increases the substrate removal rate during processing.

The pad assembly 106 is at least partially permeable to electrolyte at least between the electrode 110 and the working surface 128 of the processing layer 104. The pad assembly 106 is adapted to electrically bias the substrate 120 during processing by electrically coupling the substrate 120 to one terminal of the power source 166. The electrode 110 of the pad assembly 106 is coupled to another terminal of the power source 166. The electrolyte, which is introduced from the electrolyte source 170 and is disposed on the pad assembly 106, completes an electrical circuit between the substrate 120 and the electrode 110 of the pad assembly 106, which, in one embodiment, assists in the removal of material from the surface of the substrate 120.

Figure 2A:
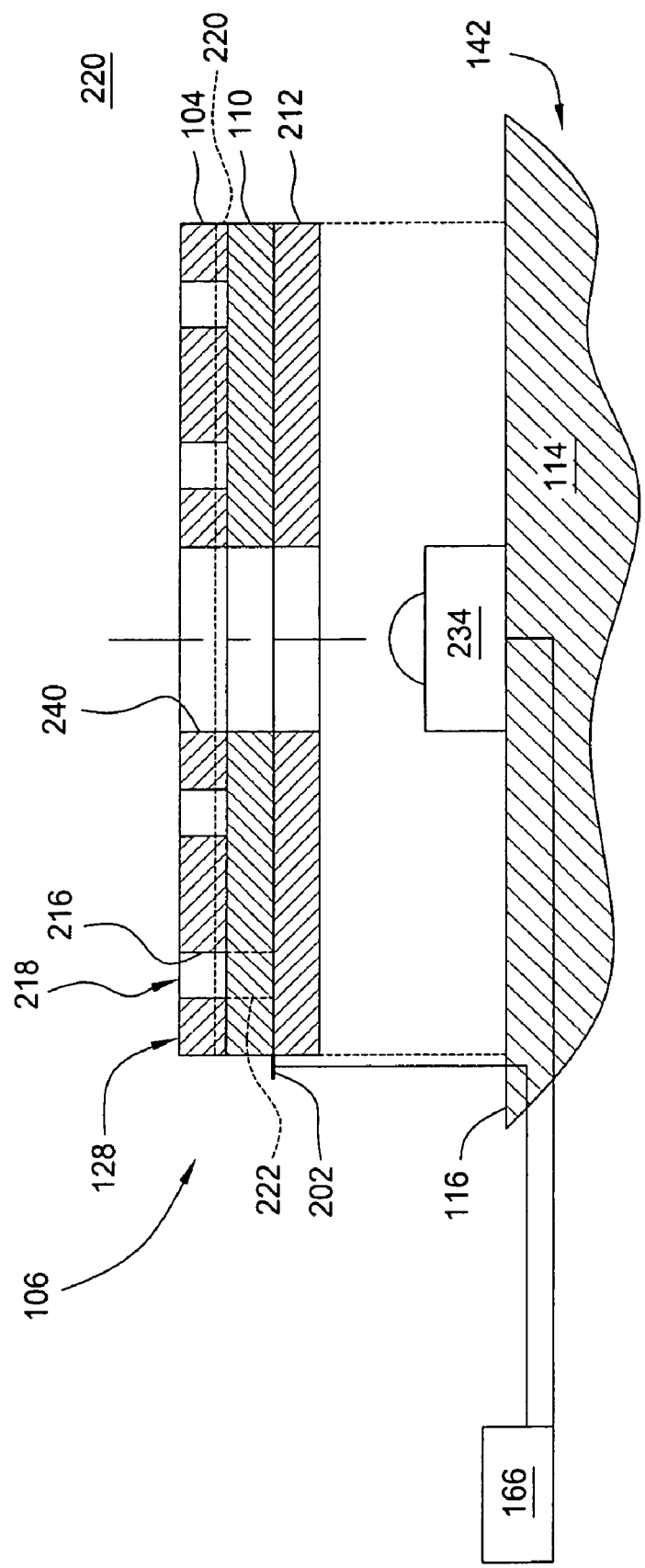
FIG. 2A is a partial cross-sectional view of one embodiment of a processing pad assembly of the processing station of FIG. 1.

FIG. 2A depicts one embodiment of the pad assembly 106. The pad assembly 106 includes at least an electrode 110 interposed between the processing layer 104 and a subpad 212. In the embodiment depicted in FIG. 2, the processing layer 104 is non-conductive. Alternatively, a conductive processing layer could be utilized with an intervening insulating layer 220 (shown in phantom) disposed between the processing layer 104 and the electrode 110. A terminal 202 is formed on the electrode 110 to facilitate connection with the power source 166.

The electrode 110, subpad 212, and processing layer 104 of the pad assembly 106 may be combined into a unitary assembly by the use of adhesives, bonding, compression molding, or the like. In one embodiment, adhesive is used to attach the electrode 110, subpad 212, and processing layer 104 together. The adhesive generally is a pressure sensitive adhesive or a temperature sensitive adhesive and should be compatible with the process chemistry as well as with the different materials used for the electrode 110, subpad 212, and/or processing layer 104. The adhesive may have a strong physical and/or chemical bond to the electrode 110, subpad 212, and processing layer 104. However, selection of the adhesive may also depend upon the form of the electrode 110, subpad 212, and processing layer 104. The adhesive bonding between the electrode 110, subpad 212, and processing layer 104 may be increased by the surface morphology of the materials selected to form the pad assembly 106 (i.e., fabrics, screens, and perforations versus solids). For example, if the electrode 110 is fabricated from a screen, mesh, or perforated foil, a weaker adhesive may be selected due to the increased surface area of the electrode 110.

The pad assembly 106 is disposed on the top surface 116 of the upper plate 114 of the platen assembly 142 and may be held there by magnetic attraction, static attraction, vacuum, adhesives, or the like. In one embodiment, adhesive is used to adhere the subpad 212 of the pad assembly 106 to the upper plate 114.

In one embodiment, at least one permeable passage 218 is disposed through the processing layer 104 and extends at least to the electrode 110. The passage 218 allows an electrolyte to establish a conductive path through the processing layer 104 between the substrate 120 and the electrode 110. The passage 218 may be a permeable portion of the processing layer 104, holes formed in the processing layer 104, or a combination of the two. In the embodiment depicted in FIG. 2A, the permeable passage 218 is a plurality of holes 216 formed in and through the processing layer 104 to allow an electrolyte to flow therethrough and come into contact with the electrode 110 during processing. The plurality of holes 216 may be formed in a rectangular pattern, a triangular pattern, or any other uniformly distributed pattern and generally has a percent open area of from about 10% to about 90% (i.e., the area of the holes open to the electrode as a percentage of the total surface area of the polishing layer). For example, FIG. 2B depicts a plan view of one embodiment of a pad assembly 106 having a plurality of holes 216 uniformly distributed across the surface of the pad assembly 106.

Although the pattern of the holes 216 should be uniform, the holes 216 may be grouped into different regions, or zones, of varying open area percentage with a uniform pattern within each respective zone. For example, FIG. 2C depicts a plan view of another embodiment of a pad assembly 106 having a first plurality of holes 216A uniformly distributed across a first zone 290 of the pad assembly 106 and a second plurality of holes 216B uniformly distributed across a second zone 292 of the pad assembly 106. The quantity and location of zones as well as the percent open area within each zone may be selected to achieve desired processing performance of the pad assembly 106. Zoned processing pad assemblies are discussed in greater detail in co-pending U.S. patent application Ser. No. 10/727,774 (titled PROCESSING PAD ASSEMBLY WITH ZONE CONTROL, filed Dec. 3, 2003 by ANTOINE P. MANENS, which is hereby incorporated by reference in its entirety.

Figure 2B:
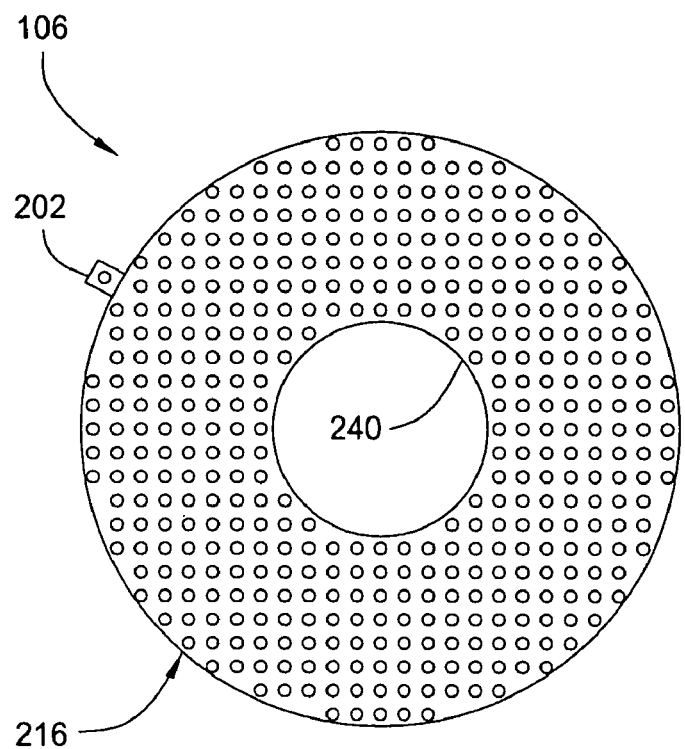
FIG. 2B is a plan view of one embodiment of the pad assembly of FIG. 2A.
Figure 2C:
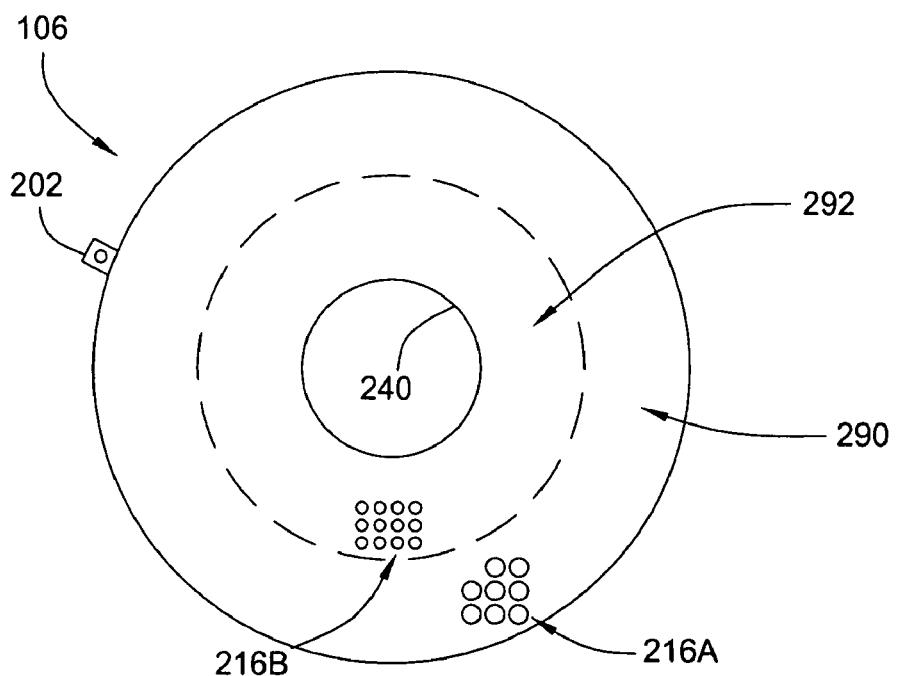
FIG. 2C is a plan view of another embodiment of the pad assembly of FIG. 2A.

It should be noted that although the holes depicted in FIGS. 2A–2C are round, it is contemplated that any shape or form of opening which allows electrolyte to flow through the processing layer 104 and to come into contact with the electrode 110 and the substrate 120 during processing. Furthermore, the teachings described herein with respect to the at least one permeable passage 218, e.g., the plurality of holes 216, distribution, percent open area, zones, and the like, are equally applicable to all embodiments of polishing pad assemblies described herein.

The plurality of holes 216 may be molded in the processing layer 104 as formed, or the holes 216 may be formed by, for example, a steel rule die, an ultrasonic knife/punch, or a male/female die punch, among other forming methods. Care should be taken in perforating the processing layer 104 as any irregularities in the working surface 128 of the processing layer 104 may cause damage to the substrate 120. The location and open area percentage of the holes 216 in the processing layer 104 controls the quantity and distribution of electrolyte contacting the electrode 110 and substrate 120 during processing, thereby controlling the rate of removal of material from the surface of the substrate 120 in a polishing operation, or the rate of deposition in a plating operation.

Optionally, an extension 222 of the permeable passage 218 may be formed in and at least partially through the electrode 110 (shown in phantom) in order to increase the surface area of the electrode 110 in contact with the electrolyte. The extension 222 may extend completely through the electrode 110. The larger surface area of electrolyte contact with the electrode 110 improves the rate of removal of material from the surface of the substrate 120 during polishing and the rate of deposition during plating.

The subpad 212 is typically made of a material softer, or more compliant, than the material of the processing layer 104. The difference in hardness or durometer between the processing layer 104 and the subpad 212 may be chosen to produce a desired polishing/plating performance. The subpad 212 may also be compressible. Examples of suitable subpad 212 materials include, but are not limited to, open or closed-cell foamed polymer, elastomers, felt, impregnated felt, plastics, and like materials compatible with the processing chemistries.

At least one aperture 240 is formed through the pad assembly 106. Each of the at least one aperture 240 is of a size and location to accommodate a contact element 234 passing therethrough. In the embodiment depicted in FIG. 2, one aperture 240 is centrally formed through the processing layer 104, electrode 110, and subpad 212 of the pad assembly 106. The aperture 240 is aligned with the contact element 234 centrally disposed on the upper plate 114 of the platen assembly 142. The contact element 234 is coupled through the platen assembly 142 to the power source 166 and is adapted to electrically bias the feature side 112 of the substrate 120 during processing. Examples of contact elements 234 suitable for use with this invention are more fully described in U.S. patent application Ser. No. 10/642,128 filed Aug. 15, 2003, previously incorporated by reference in its entirety. Although only one contact element 234 is depicted in FIG. 2A, multiple contact elements 234 may be disposed on the upper plate 114 of the platen assembly 142 in any number or geometry. Alternatively, the contact element 234 may be include a plurality of conductive elements disposed in or embedded within the processing layer 104, or the processing layer 104 may be made of a conductive material, or some combination of conductive and non-conductive elements, materials, and the like.

Figure 3A:
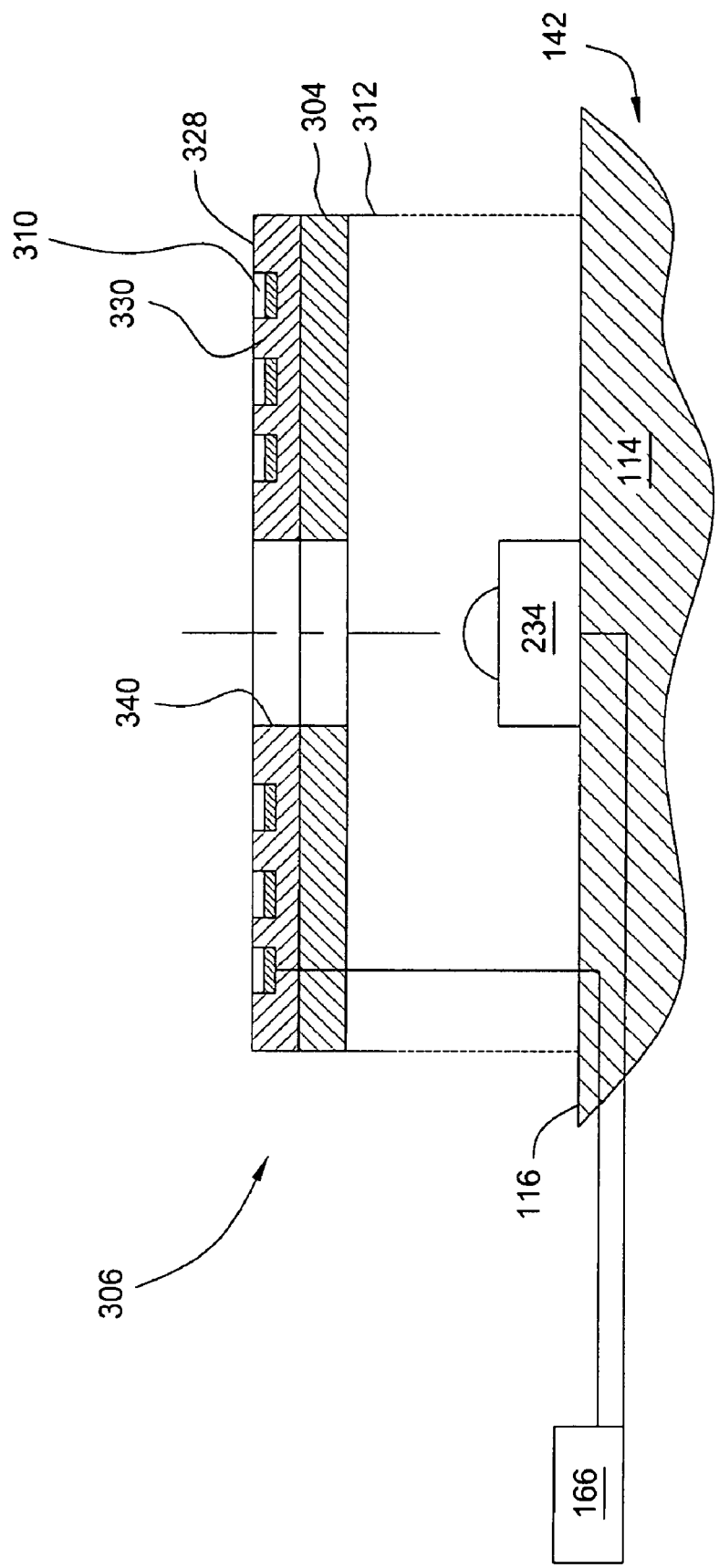
FIG. 3A is a partial cross-sectional view of another embodiment of a processing pad assembly of the polishing station of FIG. 1.
Figure 3B:
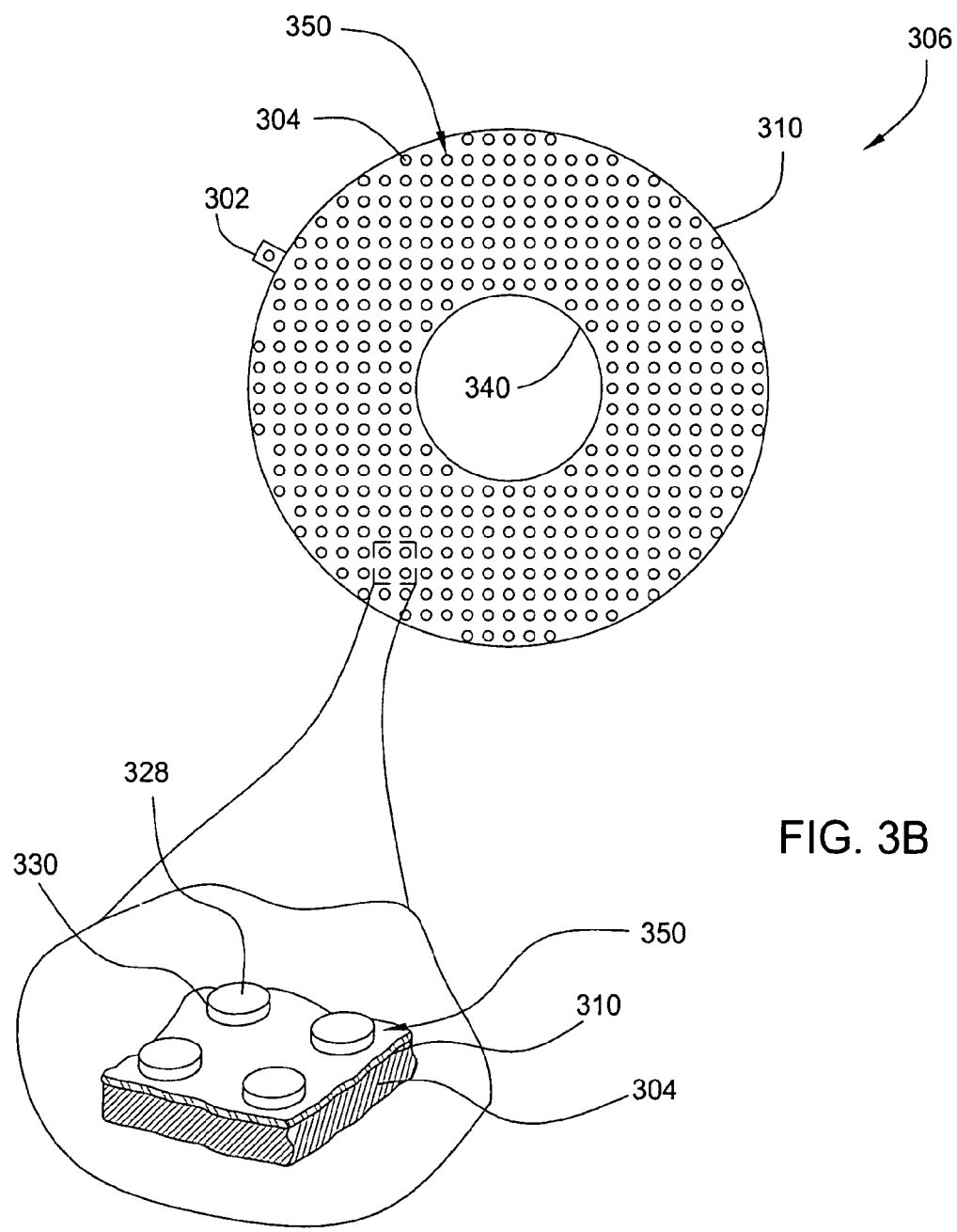
FIG. 3B is a plan view of the processing pad assembly of FIG. 3A.

FIGS. 3A and 3B depict another embodiment of a pad assembly 306 having at least a processing layer 304 interposed between an electrode 310 and a subpad 312. A terminal 302 is formed on the electrode to facilitate coupling the electrode 310 to the power source 166. In this embodiment, the electrode 310 is perforated by a plurality of holes 350. The processing layer 304 has a plurality of coincident raised portions 330 which align with and protrude through the plurality of holes 350 on the electrode 310 to form a plurality of discrete working surfaces 328 disposed above the electrode 310. The recessed area between the raised portions 330 facilitate the flow of electrolyte and/or polishing fluid across the electrode 310 and improve the processing rate and surface uniformity of the substrate 120. The discrete working surfaces 328, being decoupled from one another, promote global conformance of the discrete working surfaces 328 to the feature side 112 of the substrate 120 during processing.

In the embodiment depicted in FIGS. 3A and 3B, the processing layer 304 is dielectric, for example, polyurethane. Alternatively, the processing layer 304 could be conductive. In embodiments where the processing layer 304 is conductive, an insulator may be disposed between the processing layer 304 and the electrode 310 by, for example, coating the electrode 310 with a dielectric and selectively removing the coating where exposure of the electrode 310 to the electrolyte is desired.

Figure 4A:
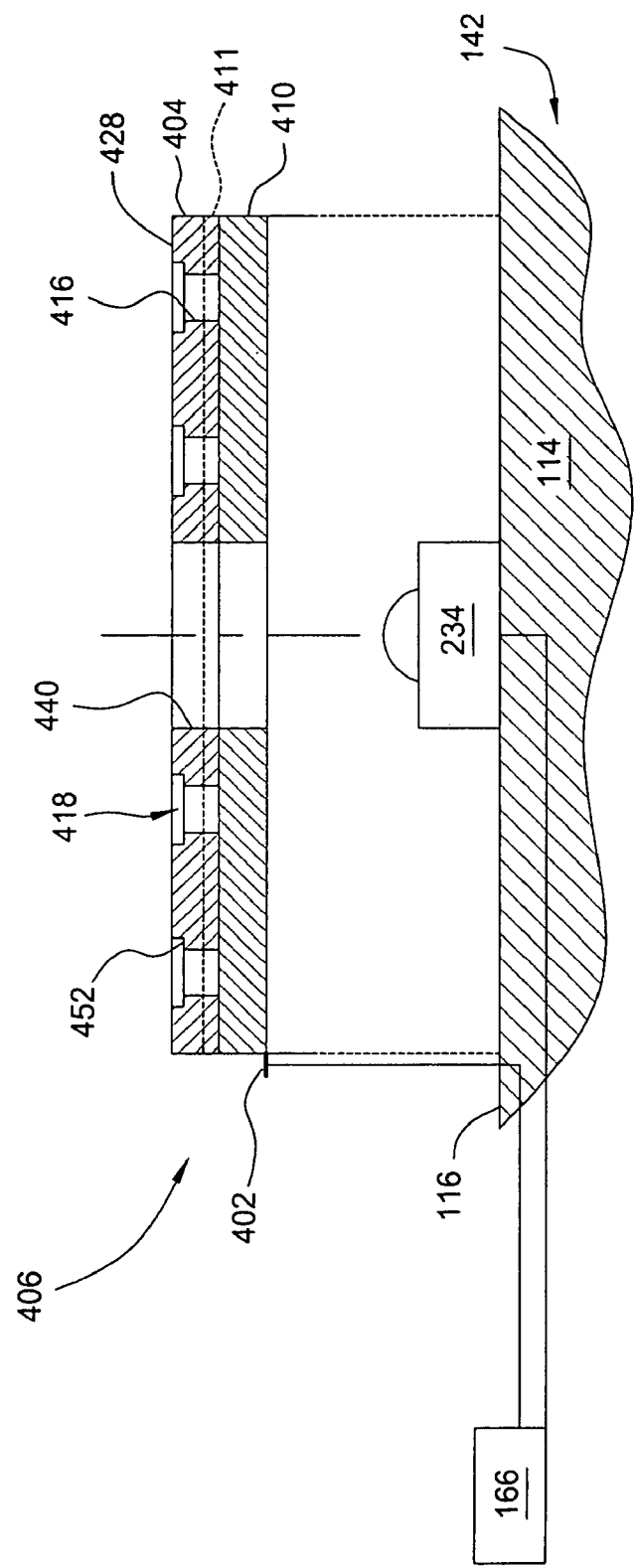
FIG. 4A is a partial cross-sectional view of another embodiment of a processing pad assembly of the polishing station of FIG. 1.
Figure 4B:
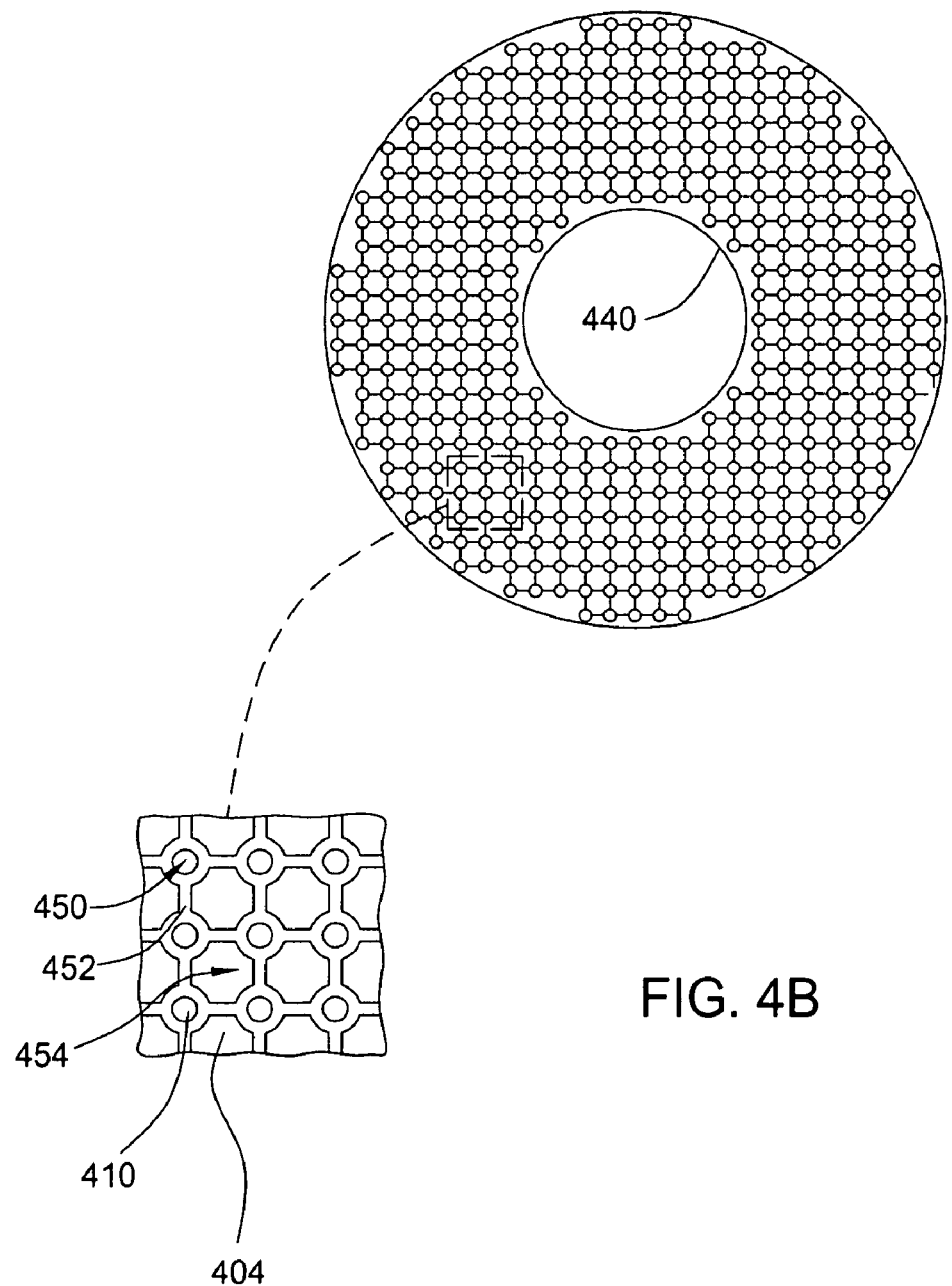
FIG. 4B is a plan view of the processing pad assembly of FIG. 4A.

FIGS. 4A and 4B depict another embodiment of a pad assembly 406 having at least a processing layer 404 and an electrode 410. A terminal 402 is formed on the electrode 410 to facilitate coupling the electrode 410 to the power source 166. The processing layer 404 includes a plurality of grooves 452 formed partially through the processing layer 404 and a plurality of permeable passages 418 extending completely through the processing layer 404. An insulative layer 411 (shown in phantom), for example a dielectric, is disposed between the processing layer 404 and the electrode 410 when the processing layer 404 is conductive. The insulative layer 411 is permeable to electrolyte at least where electrolyte contact with the electrode is desired. For example, the insulative layer 411 may be perforated with holes to extend the permeable passage 418 to the electrode 410. In the embodiment depicted in FIGS. 4A and 4B, the grooves 452 are arranged in a orthogonal grid. Alternatively, the grooves may be arranged in a triangular pattern, concentric circles, spirals, waves, or a combination thereof, among other configurations. The grooves 452 facilitate the flow of electrolyte and/or polishing fluid across the processing layer 404 and improve the processing rate and surface uniformity of the substrate 120 by ensuring good electrical contact to a large surface area of the electrode 410. The pattern of the grooves 452 forms a plurality of discrete pad areas 454 in the processing layer 404. The discrete pad areas 454 have more flexibility to conform to the feature side 112 of the substrate 120 during processing.

The permeable passages 418 allow electrolyte to contact the electrode 410 and the substrate 120 during processing. In the embodiment depicted in FIGS. 4A and 4B, the plurality of permeable passages 418 is a plurality of holes 450 extending completely through the processing layer 404. The holes 450 may be formed within the grooves 452 such that any protrusions, burrs, flash, or unevenness which may be caused by the forming of the holes 450 in the processing layer 404 is disposed below a working surface 428 of the pad assembly 406. In the embodiment depicted in FIGS. 4A and 4B, the plurality of holes 450 have a diameter which is larger than the nominal width of the grooves 452, and the grooves 452 are widened at each intersection in order to circumscribe each of the holes 450. The spacing of the permeable passages 418 below the working surface 428 advantageously reduces the probability of damage to the feature side 112 of the substrate 120 from any anomalies around the edges of the permeable passages 418.

The embodiments of processing pad assemblies discussed above are general depictions of the configuration of the processing layer and the electrode and any other necessary components, as noted. It is contemplated that other layers may be added and/or configurations may be construed using the principles discussed above. For example, release layers and liners may be added to accommodate the attachment and detachment of the polishing pad assemblies from the platen assembly.

Figure 5:
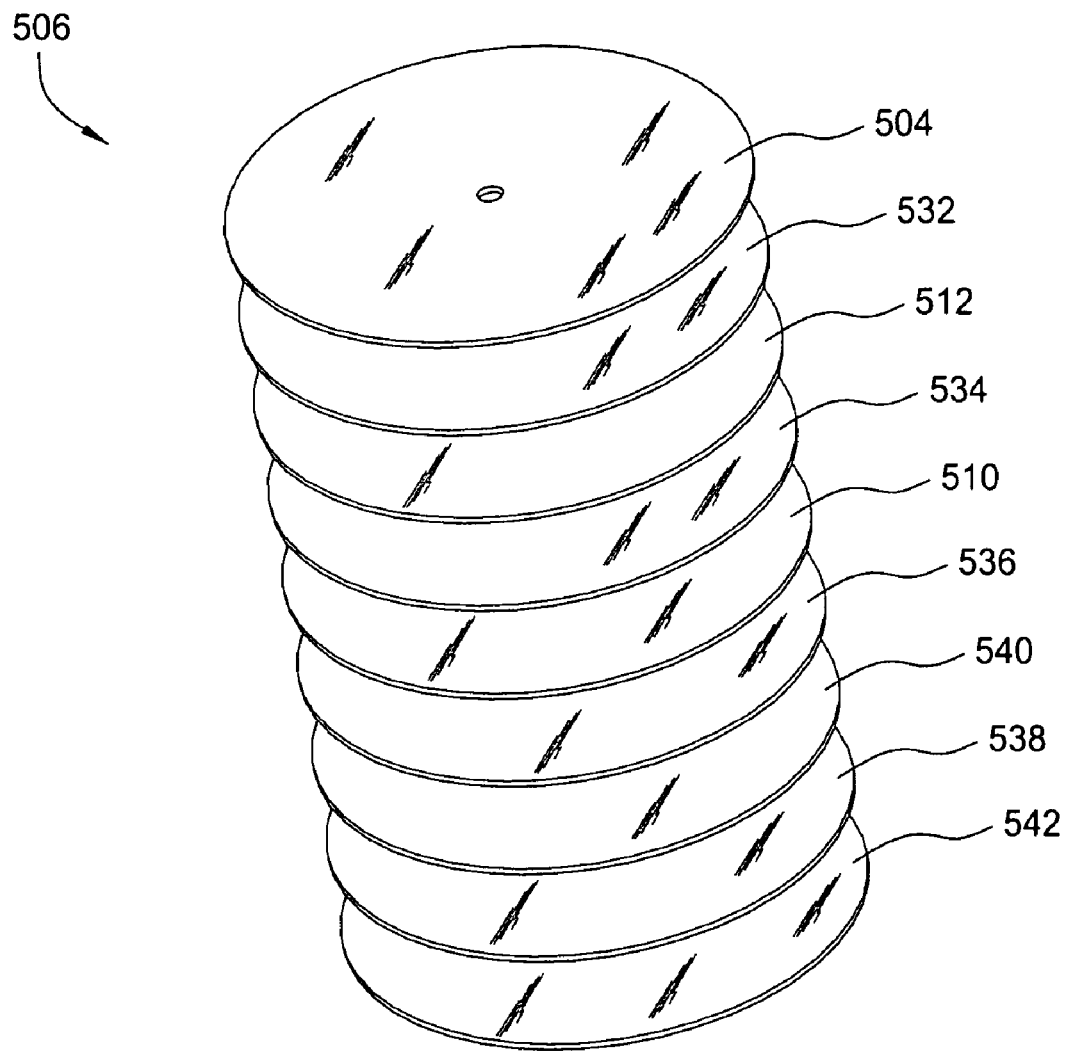
FIG. 5 is an exploded isometric view of one embodiment of a processing pad assembly.

For example, FIG. 5 depicts an exemplary illustration of one embodiment of a pad assembly 506 configured to facilitate handling and replacement. In this embodiment, a processing layer 504 and electrode 510 are interposed by a subpad 512. The processing layer 504, electrode 510, and subpad 512 are bonded together by adhesive layers 532, 534. An adhesive layer 536 bonds a release film 540 to the bottom of the electrode 510. A final adhesive layer 538 is disposed below the release film 540 to facilitate adhering to the upper plate 114 of the platen assembly 142 (shown in FIG. 1). A liner 542 is attached to the final adhesive layer 538 to facilitate handling and is removed prior to installation. The release film facilitates easy removal of the pad assembly 506 from the platen assembly 142. The release film, liner, and intervening adhesive layers may be utilized in other embodiments of the pad assembly, including those embodiments described above.

While the foregoing is directed to the illustrative embodiment of the present invention, other and further embodiments of the invention may be devised without departing from the basic scope thereof, and the scope thereof is determined by the claims that follow.

What is claimed is:

1. A pad assembly for processing a substrate, comprising:
 a processing layer made of a conductive material having a working surface adapted to process the substrate;
 a lower layer coupled to and disposed below the processing layer;
 an electrode having an upper surface disposed above the lower layer and below the working surface of the processing layer, wherein the upper surface of the electrode is at least partially exposed to the working surface to provide an electrolyte pathway between the upper surface of the electrode and the working surface; and
 an insulative layer coupled between the electrode and the processing layer.

2. The pad assembly of claim 1, further comprising:
 at least one aperture formed through the lower layer, the processing layer, and the electrode.

3. The pad assembly of claim 2, wherein the at least one aperture is a single aperture formed through the center of the lower layer, the processing layer, and the electrode.

4. The pad assembly of claim 1, wherein the working surface of the processing layer is exposed to the upper surface of the electrode through a plurality of holes formed through the processing layer.

5. The pad assembly of claim 4, wherein the plurality of holes is formed in a rectangular pattern.

6. The pad assembly of claim 4, wherein the plurality of holes is formed in a triangular pattern.

7. The pad assembly of claim 4, wherein the plurality of holes defines an open area of between about 10 to about 90 percent of the working surface.

8. The pad assembly of claim 4, wherein the plurality of holes further comprises:
 at least two concentric groupings of holes each having an open area of between about 10 to about 90 percent of the working surface, wherein at least two of the at least two groupings of holes have different size open areas.

9. The pad assembly of claim 1, wherein the lower layer, electrode, and processing layer are coupled together by an adhesive.

10. The pad assembly of claim 9, further comprising:
 an adhesive layer formed on a bottom of the lower layer; and
 a removeable liner covering the adhesive layer.

11. The pad assembly of claim 1, wherein the electrode is made of one of Cu, Ti, Sn, Ni, or stainless steel.

12. The pad assembly of claim 1, wherein the electrode has a stiffness low enough to ensure confomiability and remain substantially flat.

13. The pad assembly of claim 1, wherein the electrode is made of a metal foil.

14. The pad assembly of claim 1, wherein the electrode is made of a mesh comprised of metal wire or metal-coated wire.

15. A pad assembly for processing a substrate, comprising:
 a processing layer having a working surface adapted to process the substrate;
 a lower layer coupled to and disposed below the processing layer;
 an electrode having an upper surface disposed above the lower layer and below the working surface of the processing layer, wherein the upper surface of the electrode is at least partially exposed to the working surface to provide an electrolyte pathway between the upper surface of the electrode and the working surface;
 an insulative layer coupled between the electrode and the processing layer, wherein the processing layer is made of a conductive material;
 wherein the lower layer, electrode, and processing layer are coupled together by an adhesive; and
 a release film coupled to a bottom of the lower layer.

16. A pad assembly for processing a substrate, comprising:
 a processing layer having a working surface adapted to process the substrate;
 a lower layer coupled to and disposed below the processing layer;
 an electrode having an upper surface disposed above the lower layer and below the working surface of the processing layer, wherein the upper surface of the electrode is at least partially exposed to the working surface to provide an electrolyte pathway between the upper surface of the electrode and the working surface;
 an insulative layer coupled between the electrode and the processing layer, wherein the processing layer is made of a conductive material; and
 wherein the electrode is made of a laminate of a metal foil on top of a polyimide, polyester, flouroethylene, polypropylene, or polyethylene film.

17. A pad assembly for processing a substrate, comprising:
 a processing layer having a working surface adapted to process the substrate;
 a lower layer coupled to and disposed below the processing layer;
 an electrode having an upper surface disposed above the lower layer and below the working surface of the processing layer, wherein the upper surface of the electrode is at least partially exposed to the working surface to provide an electrolyte pathway between the upper surface of the electrode and the working surface;
 an insulative layer coupled between the electrode and the processing layer, wherein the processing layer is made of a conductive material; and
 wherein the electrode further comprises a plurality of holes formed therethrough and wherein the working surface of the processing layer protrudes through the plurality of holes and extends above the upper surface of the electrode.

18. The pad assembly of claim 17, wherein the plurality of holes further comprises:
at least two concentric groupings of holes each having an open area of between about 10 to about 90 percent of the working surface, wherein at least two of the at least two groupings of holes have different size open areas.

19. The pad assembly of claim 17, further comprising:
at least one aperture formed Through the lower layer, the processing layer, and the electrode.

20. The pad assembly of claim 19, wherein the at least one aperture is a single aperture formed through the center of the lower layer, the processing layer, and the electrode.

21. The pad assembly of claim 17, further comprising:
a dielectric layer disposed between the electrode and the processing layer, wherein the processing layer is made of a conductive material.

22. A pad assembly for processing a substrate, comprising:
an upper layer having a working surface and a lower surface;
an electrode coupled to the lower surface of the upper layer;
two or more sets of parallel grooves formed in the working surface of the upper layer;
a plurality of holes formed through the upper layer within the two or more sets of parallel grooves and extending to the lower surface; and wherein the plurality of holes further comprises:
at least two concentric groupings of holes each having an open area of between about 10 to about 90 percent of the working surface, wherein at least two of the at least two groupings of holes have different size open areas.

23. The pad assembly of claim 22, further comprising:
at least one aperture formed through the upper layer and the conductive layer.

24. The pad assembly of claim 23, wherein the at least one aperture is a single aperture formed through the center of the upper layer and the electrode.

25. The pad assembly of claim 22, wherein the two or more sets of parallel grooves are two sets of parallel grooves orthogonally arranged to form a grid.

26. The pad assembly of claim 22, wherein the two or more sets of parallel grooves are three sets of parallel grooves and wherein each set of parallel grooves is rotated with respect to the other sets of parallel grooves to form a triangular pattern.

27. The pad assembly of claim 22, wherein the plurality of holes in the upper layer are further located at intersections of the grooves.

28. A pad assembly for processing a substrate, comprising:
an upper layer having a working surface and a lower surface;
an electrode coupled to the lower surface of the upper layer;
at least one groove formed in the working surface of the upper layer;
a plurality of holes formed through the upper layer within the at least one groove and extending to the lower surface; and
an insulative layer coupled between the electrode and the upper layer, wherein the upper layer is made of a conductive material.

29. A system for electro-mechanical processing a substrate, comprising:
a platen;
a carrier head adapted to retain the substrate during processing;
a lower layer disposed on the platen;
a processing layer, made of a conductive material disposed on the lower layer and having a working surface adapted to process the substrate;
an electrode having an upper surface disposed above the lower layer and below the working surface of the processing layer, wherein the upper surface of the electrode is at least partially exposed to the working surface to provide an electrolyte pathway between the upper surface of the electrode and the working surface; and
a dielectric leyer disposed between the electrode and the processing layer.

30. The system of claim 29, wherein the electrode further comprises:
a plurality of holes formed therethrough and wherein the working surface of the processing layer protrudes through the plurality of holes and extends above the upper surface of the electrode.

31. The system of claim 29, further comprising:
at least one groove formed in the working surface of the processing layer; and
a plurality of holes formed through the upper layer within the at least one groove and extending at least to the upper surface of the electrode.

* * * * *

UNITED STATES PATENT AND TRADEMARK OFFICE
CERTIFICATE OF CORRECTION

PATENT NO. : 7,029,365 B2
APPLICATION NO. : 10/744904
DATED : April 18, 2006
INVENTOR(S) : Shou-Sung Chang et al.

It is certified that error appears in the above-identified patent and that said Letters Patent is hereby corrected as shown below:

On the Cover of the Patent

Item [63], Related U.S. Application Data: Please make the following changes:

After "6,979,248,", change "which" to --and--

After "Aug. 2, 2002,", change "which" to --and said application No. 10/608,513--

After "Aug. 2, 2002,", insert --which is also a continuation-in-part of application No. 09/505,899, filed on Feb. 17. 2000, now Pat. No. 6,537,144,--

After "Mar. 18, 2003,", insert --and said application No. 10/642,128 is a continuation-in-part of application No. 10/244,697, filed Sep. 16, 2002,--

After making these changes, the resulting Related U.S. Application Data should read:

Continuation-in-part of application No. 10/642,128, filed on Aug. 15, 2003, now Pat. No. 6,962,524, which is a continuation-in-part of application No. 10/608,513, filed on Jun. 26, 2003, which is a continuation-in-part of application No. 10/104,010, filed on May 7, 2002, now Pat. No. 6,979,248,
and a continuation-in-part of application No. 10/211,626, filed on Aug. 2, 2002, which is a continuation-in-part of application No. 10/033,732, filed on Dec.27, 2001, which is a continuation-in-part of application No. 09/505,899, filed on Feb. 17, 2000, now Pat. No. 6,537,144,
said application No. 10/608,513 is a continuation-in-part of application No. 10/210,972, filed on Aug. 2, 2002,
which is also a continuation-in-part of application No. 09/505,899, filed on Feb. 17, 2000, now Pat. No. 6,537,144,
and said application No. 10/608,513 is a continuation-in-part of application No. 10/151,538, filed on May 16, 2002, now abandoned,
said application No. 10/642,128 is a continuation-in-part of application No. 10/391,324, filed on Mar. 18, 2003,
and said application No. 10/624,128 is a continuation-in-part of application No. 10/244,697, filed Sep. 16,2002,
which is a continuation-in-part of application No. 10/244,688, filed on Sep. 16, 2002, now Pat. No. 6,848,970.

Item [56], References Cited, U.S. Patent Documents: Change "8,892,338" to --6,692,338--

UNITED STATES PATENT AND TRADEMARK OFFICE
CERTIFICATE OF CORRECTION

PATENT NO. : 7,029,365 B2
APPLICATION NO. : 10/744904
DATED : April 18, 2006
INVENTOR(S) : Shou-Sung Chang et al.

It is certified that error appears in the above-identified patent and that said Letters Patent is hereby corrected as shown below:

In the Claims

Column 9, Claim 7, Line 56: Change "whereln" to --wherein--

Column 10, Claim 12, Line 8: Change "confomiability" to --conformability--

Column 11, Claim 19, Line 11: Change "Through" to --through--

Column 12, Claim 29, Line 24: Add a comma after "material"

Column 12, Claim 29, Line 34: Change "leyer" to --layer--

Signed and Sealed this

Fifth Day of December, 2006

JON W. DUDAS
*Director of the United States Patent and Trademark Office*